(12) United States Patent
Kim et al.

(10) Patent No.: US 7,782,120 B2
(45) Date of Patent: Aug. 24, 2010

(54) INTERNAL VOLTAGE GENERATING CIRCUIT

(75) Inventors: Myung-Jin Kim, Ichon (KR); Dong-Hwee Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 36 days.

(21) Appl. No.: 12/051,748

(22) Filed: Mar. 19, 2008

(65) Prior Publication Data

US 2009/0091376 A1     Apr. 9, 2009

(30) Foreign Application Priority Data

Oct. 4, 2007    (KR) ...................... 10-2007-0099853

(51) Int. Cl.
G05F 3/02 (2006.01)

(52) U.S. Cl. .................. 327/535; 327/536; 327/537

(58) Field of Classification Search ............... None
See application file for complete search history.

(56) References Cited

U.S. PATENT DOCUMENTS

| 6,373,753 | B1 | 4/2002 | Proebsting |  |
|---|---|---|---|---|
| 6,853,567 | B2 | 2/2005 | Kwon |  |
| 7,091,769 | B2 * | 8/2006 | Kwon et al. | 327/535 |
| 7,282,986 | B2 * | 10/2007 | Kang et al. | 327/536 |
| 7,282,987 | B2 * | 10/2007 | Lee et al. | 327/536 |
| 2004/0208026 | A1 | 10/2004 | Kwon |  |
| 2004/0239409 | A1 | 12/2004 | Jang et al. |  |
| 2006/0097804 | A1 | 5/2006 | Im et al. |  |

FOREIGN PATENT DOCUMENTS

| JP | 2003-030985 | 1/2003 |
| JP | 2005-318034 | 11/2005 |
| KR | 1020030025514 A | 3/2003 |
| KR | 1020040037787 A | 5/2004 |
| KR | 1020060000867 A | 1/2006 |

OTHER PUBLICATIONS

Jan M. Rabaey, Digital integrated Circuits a Designal Perspective, Prentice Hall 1996 pp. 117-118, ISBN0-13-178609-1.*

* cited by examiner

*Primary Examiner*—Lincoln Donovan
*Assistant Examiner*—Khareem E Almo
(74) *Attorney, Agent, or Firm*—Baker & McKenzie LLP

(57) ABSTRACT

Disclosed is an internal voltage generating circuit that pumps charge to generate an internal driving voltage. The internal voltage generating circuit includes: a first oscillation signal generating unit that provides a first oscillation signal in response to a detected internal voltage and a predetermined test mode signal; a second oscillation signal generating unit that divides an external clock to provide a second oscillation signal having a variable oscillation period; and a switching unit that selects the first oscillation signal or the second oscillation signal in response to the predetermined test mode signal and provides the selected signal as a pumping period signal.

25 Claims, 9 Drawing Sheets

| INPUT SIGNAL | | | OUTPUT SIGNAL | | | | | | | |
|---|---|---|---|---|---|---|---|---|---|---|
| TNOSC<0> | TNOSC<1> | TNOSC<2> | DECO<0> | DECO<1> | DECO<2> | DECO<3> | DECO<4> | DECO<5> | DECO<6> | DECO<7> |
| L | L | L | H | L | L | L | L | L | L | L |
| H | L | L | L | H | L | L | L | L | L | L |
| L | H | L | L | L | H | L | L | L | L | L |
| H | H | L | L | L | L | H | L | L | L | L |
| L | L | H | L | L | L | L | H | L | L | L |
| H | L | H | L | L | L | L | L | H | L | L |
| L | H | H | L | L | L | L | L | L | H | L |
| H | H | H | L | L | L | L | L | L | L | H |

INTERNAL VOLTAGE GENERATING CIRCUIT

CROSS-REFERENCES TO RELATED APPLICATION

The present application claims priority under 35 U.S.C. 119(a) to Korean Patent Application number 10-2007-0099853, filed on Oct. 4, 2007, in the Korean Intellectual Property Office, the contents of which are incorporated herein by reference in their entirety as if set forth in full.

BACKGROUND

1. Technical Field

The embodiments described herein relate to an internal voltage generating circuit, and more particularly, to an internal voltage generating circuit using a charge pump.

2. Related Art

Conventional semiconductor memory apparatuses are supplied with an external power supply voltage VDD and a ground voltage VSS and generate an internal voltage required for internal operations.

The following voltages are used for internal operations of the semiconductor memory apparatus: a core voltage Vcore that is applied to a memory core region; a high voltage Vpp used to drive word lines and for overdriving; and a substrate bias voltage Vbb that is supplied as a bulk voltage of a semiconductor substrate.

In particular, in recent years, in order to improve drivability of a part of a circuit, a negative voltage having an absolute value that is equal to more than that of the substrate bias voltage Vbb has been used. For example, a low voltage VNDS is applied to a source of an NMOS transistor sense in a sense amplifier circuit. In this way, it is possible to improve a driving speed during the under-driving of a sense amplifier circuit.

Since the level of the low voltage VNDS is lower than that of the ground voltage VSS, a charge pump is provided to supply and pump charges.

FIG. 1 is a block diagram illustrating a conventional internal voltage generating circuit for generating the low voltage VNDS. Referring to FIG. 1, the internal voltage generating circuit includes a voltage detector 10, an oscillator 20, and a charge pump 30.

The voltage detector 10 detects the level of the low voltage VNDS and provides an oscillation control signal OSC_EN.

The oscillator 20 provides a pumping period signal VNOSC having a predetermined period in response to the result detected by the voltage detector 10. The oscillator 20 may be a ring oscillator composed of an inverter chain.

The charge pump 30 generates a desired low voltage VNDS in response to a pumping period signal VNOSC, which is an oscillation signal output from the oscillator 20. That is, the charge pump 30 is configured to pump charges according to the pumping period signal VNOSC until a predetermined voltage is obtained, to generate the low voltage VNDS. Meanwhile, in order to prevent the level of the low voltage VNDS from being excessively lowered the output low voltage VNDS is fed back to the voltage detector 10. When the low voltage VNDS that is fed back is excessively low, the voltage detector 10 provides a inactivated oscillation control signal OSC_EN to inactivate the oscillator 20. Then, the charge pump 30 is also inactivated.

However, in a low-power semiconductor memory apparatus, in a low external voltage (VDD) range, the speed of the pumping period signal of the internal voltage generating circuit decreases, which results in a low charge pumping performance of a charge pump.

SUMMARY

An internal voltage generating circuit capable of selecting an oscillation period signal is described herein.

According to one aspect, an internal voltage generating circuit for pumping charge to provide an internal driving voltage is provided. The internal voltage generating circuit includes: a first oscillation signal generating unit that provides a first oscillation signal in response to a detected internal voltage and a predetermined test mode signal; a second oscillation signal generating unit that divides an external clock to provide a second oscillation signal having a variable oscillation period; and a switching unit that selects the first oscillation signal or the second oscillation signal in response to the predetermined test mode signal and provides the selected signal as a pumping period signal.

According to another aspect, an internal voltage generating circuit includes: a voltage detector that detects the level of an internal voltage fed back and provides an oscillation control signal; a pumping signal generating block that provides a pumping period signal having a fixed period that is oscillated by a ring oscillator in response to the oscillation control signal, and provides the pumping period signal a clock signal having a variable period that is generated by dividing an external clock in a test mode; and a charge pump that pumps charge in response to the pumping period signal to output the internal voltage.

BRIEF DESCRIPTION OF THE DRAWINGS

Features, aspects, and embodiments are described in conjunction with the attached drawings, in which.

DETAILED DESCRIPTION

According to embodiments described herein, it is possible to select a pumping period signal for operating a charge pump. That is, a switching unit is provided in order to use a divided external clock signal or an oscillation period signal generated by a ring oscillator as an oscillation period signal. In this way, a pumping period signal can be selectively provided. Since the divided external clock signal is a high-frequency clock signal, it can improve a pumping performance in a low power mode.

In addition, various dividers for the divided external clock signal are provided, which makes it possible to provide pumping period signals having different periods.

Figure 1:
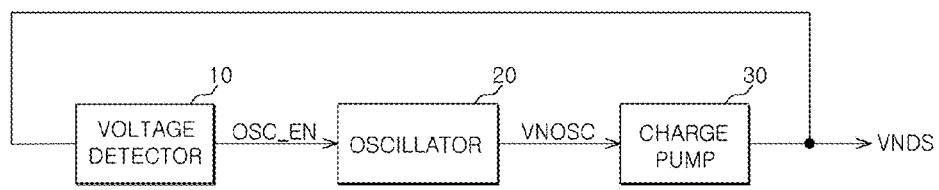
FIG. 1 is a block diagram illustrating a conventional internal voltage generating circuit.
Figure 2A:
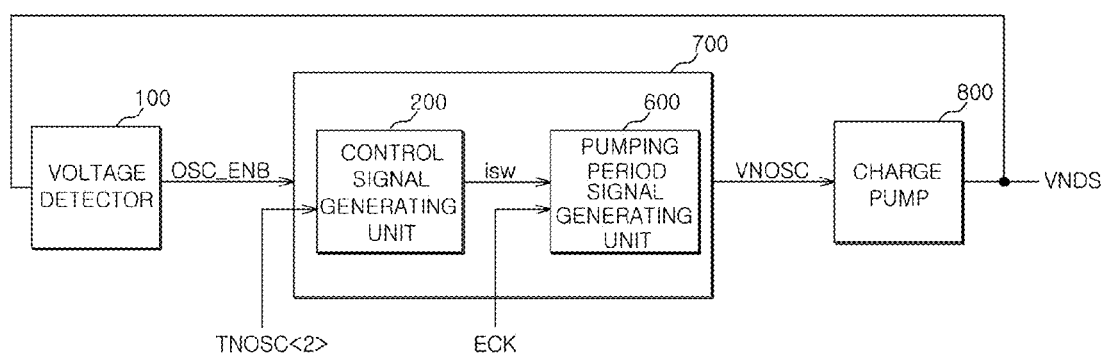
FIG. 2A is a block diagram illustrating an internal voltage generating circuit according to an embodiment.

For example, referring to FIG. 2A, an internal voltage generating circuit configured in accordance with one embodiment includes a voltage detector 100, a pumping signal generating block 700, and a charge pump 800.

The voltage detector 100 detects the level of a low voltage VNDS that is fed back and provides an oscillation control signal OSC_ENB. When the absolute value of the level of the low voltage VNDS is lower than that of a predetermined voltage, the voltage detector 100 provides an activated low-level oscillation control signal OSC_ENB. The voltage detector 100 is a general voltage detector, and thus a detailed description thereof will be omitted. However, any type of circuit may be used as the voltage detector 100 as long as it can detect the level of the low voltage VNDS that is fed back and output the oscillation control signal OSC_ENB on the basis of the low voltage VNDS. In this embodiment, a circuit is used to generate the low voltage VNDS, but the embodiments described herein are not limited thereto. For example, an internal voltage generated by charge pumping can also be used.

The pumping signal generating block 700 generates a pumping period signal VNOSC in response to the oscillation control signal OSC_ENB, a third test mode signal TNOSC<2>, which is a predetermined test mode signal, and an external clock ECK. The pumping signal generating block 700 includes a control signal generating unit 200 and a pumping period signal generating block 600.

The control signal generating unit 200 generates an oscillator activating signal isw in response to the oscillation control signal OSC_ENB and the third test mode signal TNOSC<2>. The pumping period signal generating block 600 selects the oscillation period signal that is generated by dividing the external clock or the oscillation period signal generated by the ring oscillator in response to the oscillator activating signal isw and the external clock ECK, and provides the selected oscillation period signal as a pumping period signal VNOSC. The third test mode signal TNOSC<2> will be described in detail below.

The charge pump 800 repeats charging or discharging operations in response to the oscillated waveform of the pumping period signal VNOSC to generate the low voltage VNDS. Since the charge pump 800 is composed of a general voltage pumping circuit, a detailed description thereof will be omitted.

Figure 2B:
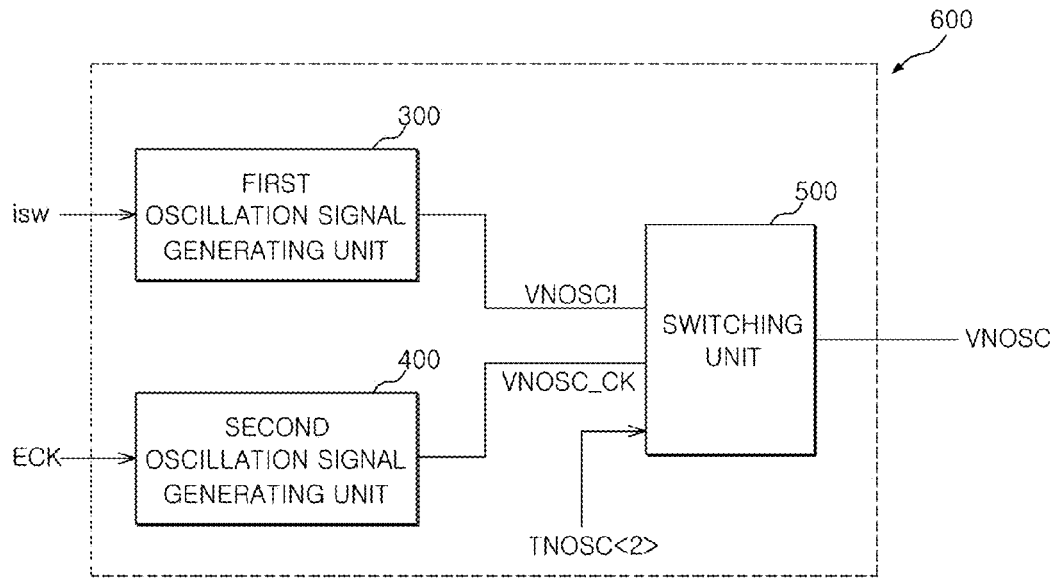
FIG. 2B is a block diagram illustrating a pumping period signal generating block shown in FIG. 2A.

Referring to FIG. 2B, the pumping period signal generating block 600 includes a first oscillation signal generating unit 300, a second oscillation signal generating unit 400, and a switching unit 500.

More specifically, the first oscillation signal generating unit 300 generates a first oscillation signal VNOSCI in response to the oscillator activating signal isw. The first oscillation signal generating unit 300 generates the first oscillation signal VNOSCI having a constant period, which is an oscillation signal generated by the ring oscillator.

In this embodiment, the second oscillation signal generating unit 400 uses the external clock ECK to generate a second oscillation signal VNOSC_CK. The second oscillation signal VNOSC_CK may be a clock signal that has a higher frequency than the first oscillation signal VNOSCI and may be a clock signal with variable period.

The switching unit 500 selects one of the first oscillation signal VNOSCI and the second oscillation signal VNOSC_CK in response to the third test mode signal TNOSC<2>, and provides the selected signal as the pumping period signal VNOSC.

Figure 3:
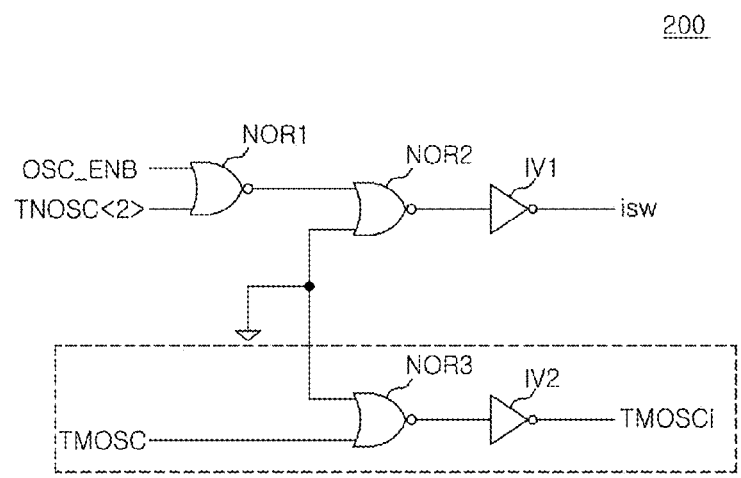
FIG. 3 is a circuit diagram illustrating a control signal generating unit shown in FIG. 2A.

Referring to FIG. 3, the control signal generating unit 200 receives the oscillation control signal OSC_ENB and the third test mode signal TNOSC<2>, which is a specific test mode signal, to generate the oscillator activating signal isw. The oscillator activating signal isw determines whether to activate the first oscillation signal generating unit (see reference numeral 300 in FIG. 2B). That is, the control signal generating unit 200 generates the oscillator activating signal isw in response to the logical level of the third test mode signal TNOSC<2>, while the oscillation control signal OSC_ENB is activated.

The control signal generating unit 200 includes first and second NOR gates NOR1 and NOR2 and a first inverter IV1.

The first NOR gate NOR1 responds to the oscillation control signal OSC_ENB and the third test mode signal TNOSC<2>. The second NOR gate NOR2 receives an output signal of the first NOR gate NOR1 and a ground voltage VSS, performs a NOR operation on the received signals, and provides the result. The first inverter IV1 inverts an output signal of the second NOR gate NOR2 and provides the oscillator activating signal isw.

That is, the control signal generating unit 200 receives the third test mode signal TNOSC<2> that is inactivated at a low level, and provides the oscillator activating signal isw that is activated at a high level, while the oscillation control signal OSC_ENB is activated. In contrast, the control signal generating unit 200 receives the third test mode signal TNOSC<2> that is activated at a high level, and provides the oscillator activating signal isw that is inactivated at a low level. Therefore, the third test mode signal TNOSC<2> determines whether to activate the oscillator activating signal isw. In this embodiment, the third test mode signal TNOSC<2> is a predetermined test mode signal that is provided from a test circuit in order to drive a specific circuit.

The control signal generating unit 200 further includes a third NOR gate NOR3 and a second inverter IV2. The third NOR gate NOR3 receives a test signal TMOSC for testing the oscillator and a ground voltage VSS, and performs a NOR operation on the received signals. The second inverter IV2 inverts an output signal from the third NOR gate NOR3 and provides an oscillator test mode signal TMOSCi. Therefore, the control signal generating unit 200 generates an activated oscillator test mode signal TMOSCi in response to the test signal TMOSC that is activated at a high level. These signals will be described in detail below with reference to the accompanying drawings.

Figure 4:
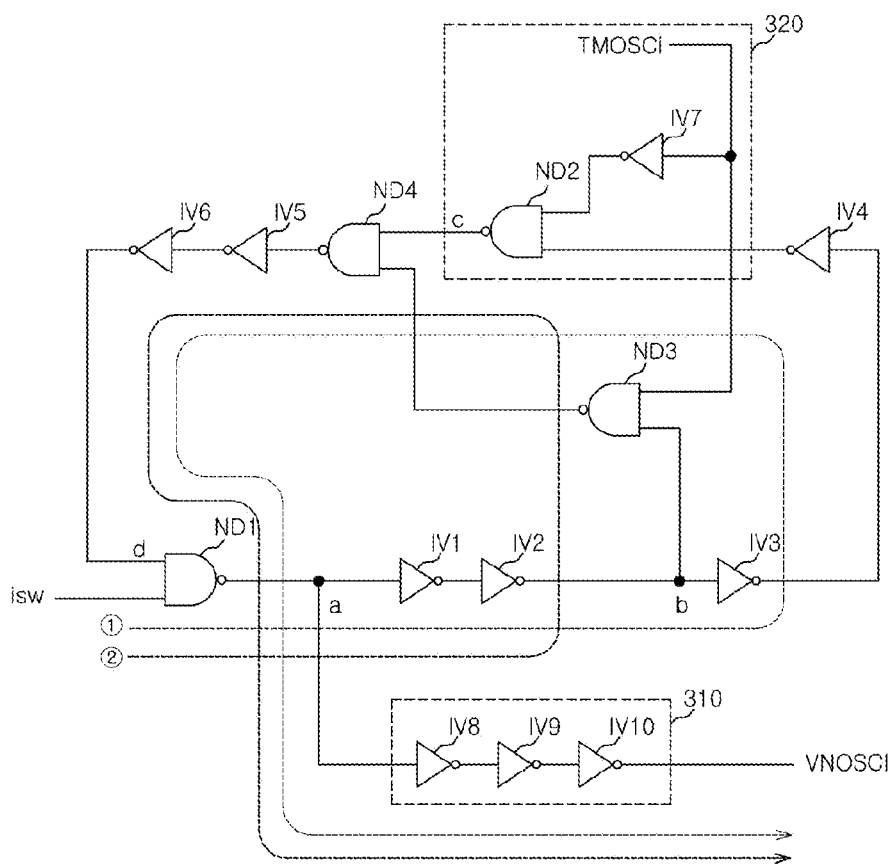
FIG. 4 is a circuit diagram illustrating a first oscillation signal generating unit shown in FIG. 2B.

Referring to FIG. 4, in the first oscillation signal generating unit 300, the logical level of the received oscillator activating signal isw is sequentially inverted while the oscillator activating signal isw passes through a plurality of inverter chains.

In this way, it is possible to generate the first oscillation signal VNOSCI having an oscillation period in response to the oscillator activating signal isw.

Next, the structure of the first oscillation signal generating unit 300 will be described below. The first oscillation signal generating unit 300 includes a first NAND gate ND1 that receives the oscillator activating signal isw, a plurality of inverting elements IV1 to IV6, ND3, and ND4, a delay 310, and an oscillator test mode signal receiving unit 320.

The first NAND gate ND1 receives the oscillator activating signal isw and a feedback signal at a node d, performs a NAND operation on the received signals, and provides the result to a node a.

The plurality of inverting elements IV1 to IV6, ND3, and ND4 is formed in a closed-loop such that they invert an output signal of the first NAND gate ND1 and provide the inverted signal to one terminal of the first NAND gate ND1. It is preferable to provide odd-numbered inverting elements, such as inverters. In this embodiment, even-numbered inverters IV1 to IV6 are provided, but the total number of inverting elements is an odd number since the third or fourth NAND gate ND3 or ND4 serves as an inverter.

The delay 310 includes an inverter chain of eighth to tenth inverters IV8 to IV10. The delay 310 may invert and delay the signal at the node a and output the delayed signal as the first oscillation signal VNOSCI.

The oscillator test mode receiving unit 320 includes a second NAND gate ND2 and a seventh inverter IV7. When receiving an activated oscillator test mode signal TMOSCi, the oscillator test mode receiving unit 320 fixes the level of a node c to a high level so as to narrow an oscillation signal generating path. Meanwhile, when receiving an inactivated oscillator test mode signal TMOSCi, the oscillator test mode receiving unit 320 provides a general oscillation signal generating path. The oscillator test mode signal TMOSCi is activated when the first oscillation signal generating unit 300 is tested.

That is, when the oscillator test mode signal TMOSCi is activated, the signal at the node c is fixed regardless of the level of the signal input to the second NAND gate ND2. Therefore, the oscillator cannot perform an oscillation operation. For this reason, the third NAND gate ND3 is provided. In this case, the third NAND gate ND3 operates as an inverter to invert the logical level of a signal, but generates an oscillation period with a narrow width.

That is, the third NAND gate ND3 receives the signal at node b and the activated oscillator test mode signal TMOSCi. Then, the third NAND gate ND3 performs a NAND operation on the received signal and provides the result to one receiving terminal of the fourth NAND gate ND4. The fourth NAND gate ND4 receives the signal at node c and the output signal from the third NAND gate ND3 and performs a NAND operation on the received signal.

When the oscillator test mode signal TMOSCi is activated, it is possible to generate the first oscillation signal VNOSCI through a short path ②. However, when the oscillator test mode signal TMOSCi is inactivated, the first oscillation signal VNOSCI is generated through a general path ①.

In this way, the first oscillation signal generating unit 300 may be composed of a general ring oscillator having a closed loop of inverting units connected in series. Meanwhile, although not shown, capacitors for minutely adjusting the delay time of each node using an RC delay may be provided.

Next, the operation of the first oscillation signal generating unit 300 will be described below.

In the following description, it is assumed that the oscillator test mode signal TMOSCi is inactivated and the oscillator activating signal isw is activated.

The first NAND gate ND1 receives the oscillator activating signal isw that is activated at a high level and provides the inverted level of the signal at the node d to the node a. Assuming that the signal at the node d has a high level at the beginning of the operation, the signal at the node a becomes a low level. The level of the signal at the node a is changed repeatedly between the high level and the low level while passing through a plurality of inverters IV1 to IV4.

One receiving terminal of the second NAND gate ND2 receives a high-level signal and the other receiving terminal thereof receives a low-level signal, in response to the inactivated oscillator test mode signal TMOSCi. Therefore, the signal at the node c becomes a high level. The fourth NAND gate ND4 receives the high-level signal at the node c and the high-level signal output from the third NAND gate ND3, and provides a low-level signal. The signal at the node d becomes a low level while passing through the inverters IV5 to IV6. That is, the level of the signal at the node d turns from a high level to a low level. In this way, it is possible to generate the first oscillation signal VNOSCI, which is a high-level oscillation signal in which the levels of the signals at the nodes continuously vary.

Next, the case in which the oscillator test mode signal TMOSCi and the oscillator activating signal isw is activated will be described below.

As described above, in this case, the level of the signal at the node c is fixed to a high level by the oscillator test mode signal receiving unit 320. Therefore, in this case, the first oscillation signal VNOSCI, which is an oscillation signal whose level repeatedly varies, is generated through the short signal generating path ② in the same manner as described above.

The first oscillation signal VNOSCI output from the first oscillation signal generating unit 300 is an oscillation signal generated by the ring oscillator according to the related art. That is, the first oscillation signal generating unit 300 is activated by the internal signals, and provides an oscillation signal with a constant period that passes through the signal inverting units and corresponds to delay time.

Figure 5:
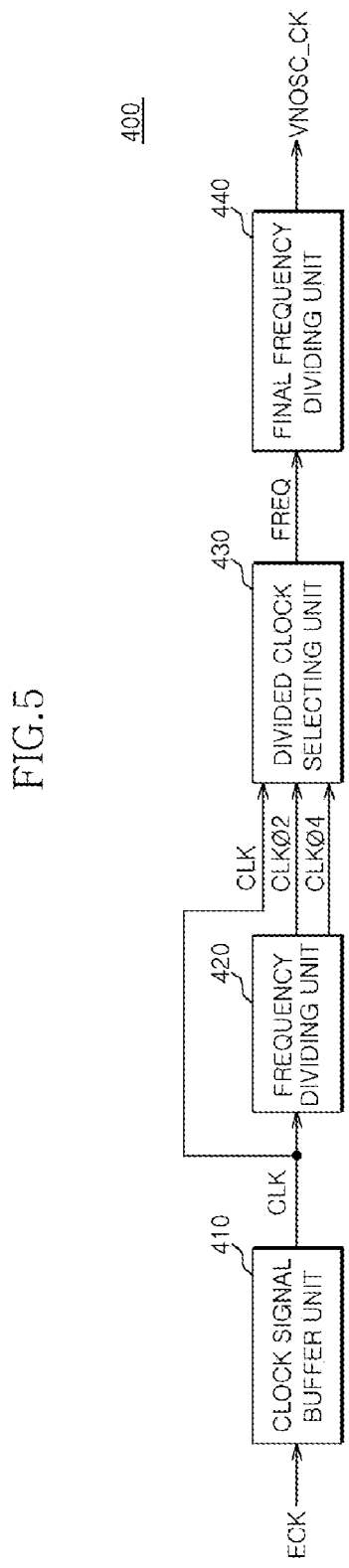
FIG. 5 is a block diagram illustrating a second oscillation signal generating unit shown in FIG. 2B.

Referring to FIG. 5, the second oscillation signal generating unit 400 includes a clock signal buffer unit 410, a frequency dividing unit 420, a divided clock selecting unit 430, and a final frequency dividing unit 440.

The clock signal buffer unit 410 buffers the external clock ECK and provides a clock signal CLK.

The frequency dividing unit 420 divides the clock signal CLK to generate a divide-by-two clock signal CLK$\phi$2 and a divide-by-four clock signal CLK$\phi$4.

The divided clock selecting unit 430 receives the clock signal CLK, the divide-by-two clock signal CLK$\phi$2, and the divide-by-four clock signal CLK$\phi$4, selects one of the received clock signals, and provides the selected clock signal as a frequency signal FREQ.

The final frequency dividing unit 440 finally divides the frequency signal FREQ by 2 to generate a second oscillation signal VNOSC_CK.

Figure 6:
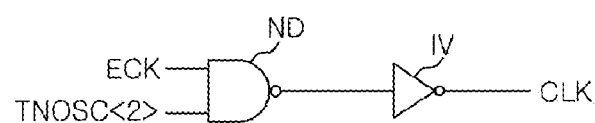
FIG. 6 is a circuit diagram illustrating a clock signal buffer shown in FIG. 5.

Referring to FIG. 6, the clock signal buffer unit 410 generates a buffered clock signal CLK in response to the external clock ECK and the third test mode signal TNOSC<2>. The clock signal buffer unit 410 includes a NAND gate ND and an inverter IV.

Specifically, the NAND gate ND receives the external clock ECK and the third test mode signal TNOSC<2> and performs a NAND operation on the received signal. The external clock ECK is a high-frequency clock signal supplied from the outside. As described above, in this embodiment, the third test mode signal TNOSC<2> is exemplified as a predetermined test mode signal capable of activating the second oscillation signal generating unit 400, but the embodiments described herein are not limited thereto. Any signal may be used as the third test mode signal TNOSC<2> as long as it can activate the second oscillation signal generating unit 400. Therefore, the clock signal buffer unit 410 may buffer the external clock ECK in response to the third test mode signal TNOSC<2> that is activated at a high level and output the buffered signal as the clock signal CLK. That is, when the clock signal buffer unit 410 receives the third test mode signal TNOSC<2> that is inactivated at a low level, the clock signal buffer unit 410 provides a fixed low-level signal without buffering the external clock ECK even when the external clock ECK is received.

Figure 7:
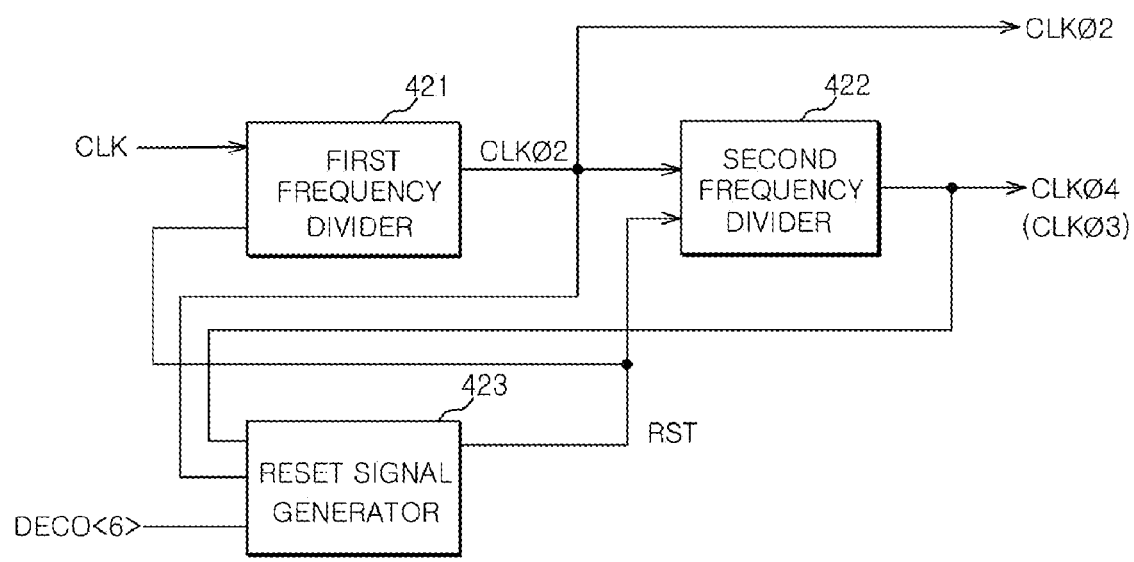
FIG. 7 is a block diagram illustrating a frequency dividing unit shown in FIG. 5.

Referring to FIG. 7, the frequency dividing unit 420 includes a first frequency divider 421, a second frequency divider 422, and a reset signal generator 423.

The first frequency divider 421 receives the clock signal CLK and generates a clock signal having a period that is two times longer than that of the clock signal CLK, that is, the divide-by-two clock signal CLKɸ2.

The second frequency divider 422 is connected in series to the first frequency divider 421, receives the divide-by-two clock signal CLKɸ2, and divides the frequency of the divide-by-two clock signal CLKɸ2 by 2 to generate the divide-by-four clock signal CLKɸ4.

The reset signal generator 423 receives the divide-by-two clock signal CLKɸ2, the divide-by-four clock signal CLKɸ4, and a specific decoding signal, that is, a seventh decoding signal DECO<6> that is decoded by a test mode signal (not shown), and generates a reset signal RST. The reset signal RST is input to the frequency dividers 421 and 422 to initialize the frequency dividers 421 and 422. Alternatively, it is possible to adjust the time when the reset signal RST is activated to generate a new divided clock signal. For example, it is possible to adjust the time when the reset signal RST input to the second frequency divider 422 is activated to generate a divide-by-three clock signal CLKɸ3.

Figure 8A:
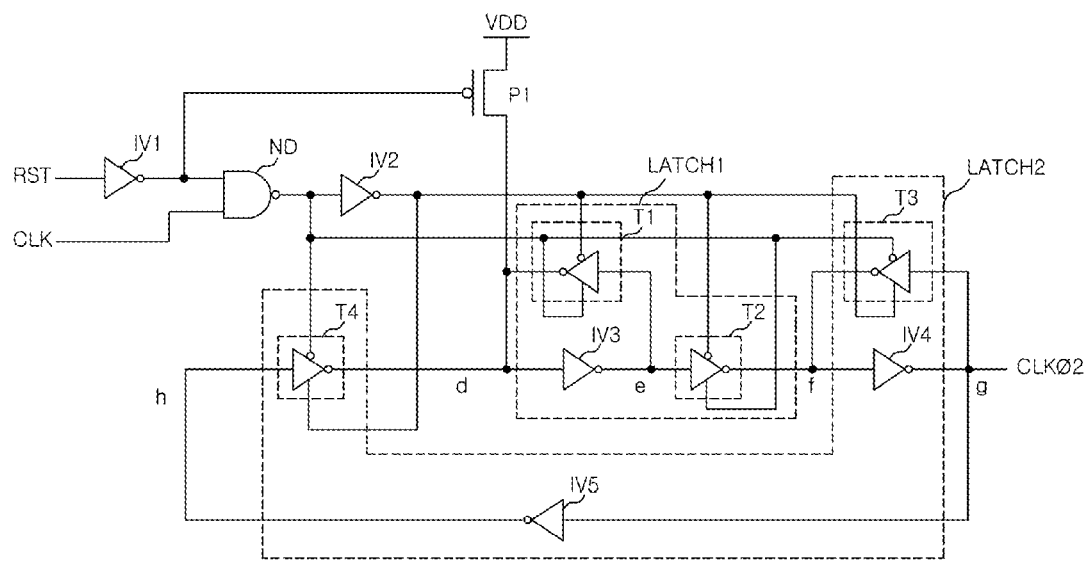
FIGS. 8A and 8B are a circuit diagram and a timing chart illustrating a first frequency divider shown in FIG. 5, respectively.
Figure 8B:
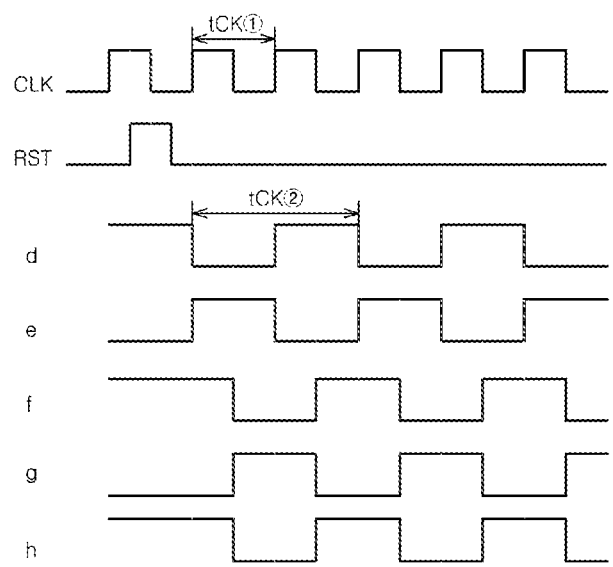

Next, the structure and operation of the first frequency divider 421 will be described with reference to FIGS. 8A and 8B.

The first frequency divider 421 includes a PMOS transistor P1 that is turned on in response to the reset signal RST, a NAND gate ND that responds to the clock signal CLK and the reset signal RST, a first latch LATCH1, and a second latch LATCH2.

The first latch LATCH1 transmits the level of the signal at the node d in response to a low-level clock signal CLK. The first latch LATCH1 includes first and second transmission elements T1 and T2, and a third inverter IV3. The first transmission element T1 and the third inverter IV3 are connected to each other in a latch structure and latch the level of the signal the node e. In this embodiment, clocked-inverters are used as the first and second transmission elements T1 and T2, but the embodiments described herein are not limited thereto.

The second latch LATCH2 inverts the level of the signal at the node f in response to a high-level clock signal CLK, and provides the inverted signal. The second latch LATCH2 includes third and fourth transmission elements T3 and T4, and fourth and fifth inverters IV4 and IV5. In this embodiment, clocked inverters are used as the third and fourth transmission elements T3 and T4, but the embodiments described herein are not limited thereto. The third transmission element T3 and the fourth inverter IV4 are connected to each other in a latch structure and latch the level of the signal the node f.

Next, the operation of the first frequency divider 421 will be described with reference to FIGS. 8A and 8B.

When the reset signal RST is activated at a high level to initialize, the first PMOS transistor P1 is turned on. Then, the signal at the node d becomes a high level, and the level of the signal at the node e is changed to a low level by the third inverter IV3. In this case, when the low-level clock signal CLK is received, the first and second transmission elements T1 and T2 are turned on by the NAND gate ND and the second inverter IV2. Then, the level of the signal at the node e is inverted by the second transmission element T2, and thus the signal at the node f becomes a high level. The levels of the signals at the node g and the node h are changed to low and high levels by the fourth and fifth inverters IV4 and IV5, respectively.

When the reset signal RST is inactivated and the high-level clock signal CLK is received, the NAND gate ND provides a low-level signal. Then, the third and fourth transmission elements T3 and T4 are turned on, while the first and second transmission elements T1 and T2 are turned off. Then, the levels of the signals at the nodes d and e are inverted to the previous levels, and the levels of the signals at the nodes f and g are latched to the previous levels by the third transmission element T3.

When the low-level clock signal CLK is received, the first and second transmission elements T1 and T2 are turned on. Then, the levels of the signals at the nodes f, g, and h are inverted to the previous levels by the second transmission element T2, and the levels of the signals at the nodes d and e are maintained at the previous levels by the first transmission element T1.

That is, when receiving the low-level clock signal CLK, the node d and the node e maintain the previous levels. Then, when receiving the high-level clock signal CLK, the levels of the signals at the node d and the node e are inverted to the previous levels. Similarly, when receiving the high-level clock signal CLK, the nodes f, g, and h maintain the previous levels. Then, when receiving the low-level clock signal CLK, the levels of the signals at the nodes f, g, and h are inverted to the previous levels.

In this way, as observing the periods of the signals that vary at the nodes in the first frequency divider 421, it is possible to generate the divide-by-two clock signal CLKɸ2 having a period tCK② that is two times longer than that of the previous clock period tCK①. In this embodiment, the first frequency divider 421 having the circuit structure shown in FIG. 8A is used as a circuit for generating a signal having a period that is two times longer than that of an input signal, but the embodiments described herein are not limited thereto. For example, a circuit using flip-flop elements may be used as the first frequency divider.

The structure and operation of the second frequency divider 422 are the same as those of the first frequency divider 421, and thus a detailed description thereof will be omitted. However, the second frequency divider 422 differs from the first frequency divider 421 in that it receives the divide-by-two clock signal CLKɸ2 having a period that is two times longer than that of the original clock signal CLK and generates the divide-by-four clock signal CLKɸ4.

Figure 9:
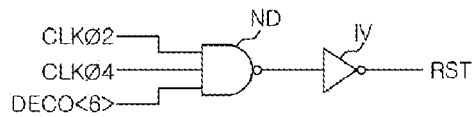
FIG. 9 is a block diagram illustrating a reset signal generator shown in FIG. 7.

Referring to FIG. 9, the reset signal generator 423 includes a NAND gate ND and an inverter IV.

When receiving a high-level divide-by-two clock signal CLKɸ2, a high-level divide-by-four clock signal CLKɸ4, and a high-level seventh decoding signal DECO<6>, the NAND gate ND provides a low-level signal. The inverter IV receives the low-level signal and generates an activated reset signal RST. That is, when high-level signals are input, the reset signal generator 423 generates the reset signal RST. The seventh decoding signal DECO<6> will be described below.

Figure 10:
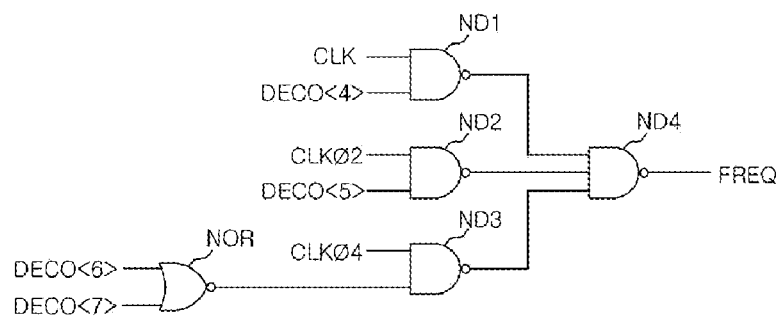
FIG. 10 is a circuit diagram illustrating a divided clock selecting unit shown in FIG. 5.

Referring to FIG. 10, the divided clock selecting unit 430 includes first to fourth NAND gates ND1 to ND4 and a NOR gate NOR.

The clock signal CLK is input to one receiving terminal of the first NAND gate ND1, and the divide-by-two clock signal CLKφ2 is input to one receiving terminal of the second NAND gate ND2. In addition, fifth and sixth decoding signals DECO<4> and DECO<5> are input to the other receiving terminals of the first and second NAND gates ND1 and ND2, respectively. The third NAND gate ND3 receives the divide-by-four clock signal CLKφ4 and an output signal from the NOR gate NOR. The NOR gate NOR receives seventh and eighth decoding signals DECO<6> and DECO<7>, and provides a high-level signal in response to one of the received signals. The fifth to eighth decoding signals DECO<4> to DECO<7> are activated signals capable of selecting a signal having a specific period.

In particular, when the third NAND gate ND3 responds to an activated seventh decoding signal DECO<6>, it can generate a divide-by-three clock signal CLKφ3, not the divide-by-four clock signal CLKφ4. As shown in FIG. 9, the seventh decoding signal DECO<6> is related to the reset signal RST. That is, the seventh decoding signal DECO<6> can determine the activation of the reset signal RST and the selection of the divide-by-three clock signal CLKφ3. Therefore, the third NAND gate ND3 adjusts the time when a signal generated from the reset signal RST and the divide-by-four clock signal CLKφ4, for example, the reset signal RST is activated to generate the divide-by-three clock signal CLKφ3 from the divide-by-four clock signal CLKφ4. However, the third NAND gate ND3 selects the divide-by-four clock signal CLKφ4 in response to an activated eighth decoding signal DECO<7>.

Therefore, when a specific decoding signal is activated, the NAND gate provides a low-level signal indicating that the divided clock signal is selected in response to the activated signal. Then, the clock signal selected by the fourth NAND gate ND4 is output as the frequency signal FREQ.

Figure 11:
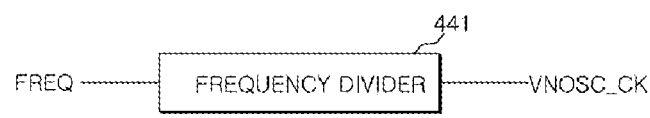
FIG. 11 is a block diagram illustrating a final frequency dividing unit shown in FIG. 5.

Referring to FIG. 11, the final frequency dividing unit 440 includes a frequency divider 441. In this embodiment, the frequency divider 441 divides the frequency of an input signal by 2. The frequency divider 441 receives a frequency signal FREQ and divides the frequency signal by 2. In this way, the duty ratio of an input signal is corrected. That is, as the number of clocks of the clock signal increases, the duty ratio of the signal is stabilized. Therefore, the final frequency divider 440 provides a second oscillation signal VNOSC_CK whose duty ratio is corrected. The structure of the frequency divider 441 is the same as that of the above-mentioned divide-by-two frequency divider that divides the frequency of an input clock signal by 2, and thus a description thereof will be omitted.

The process of generating the first oscillation signal VNOSCI and the second oscillation signal VNOSC_CK has been described above.

Next, a process of selecting the first oscillation signal VNOSCI and the second oscillation signal VNOSC_CK and outputting the selected signal as a pumping period signal VNOSC will be described below.

Figure 12:
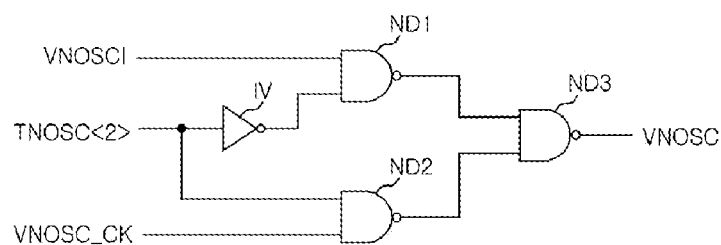
FIG. 12 is a circuit diagram illustrating a switching unit shown in FIG. 2A.

Referring to FIG. 12, the switching unit 500 selects one of the first oscillation signal VNOSCI and the second oscillation signal VNOSC_CK in response to the third test mode signal TNOSC<2>.

That is, when the third test mode signal TNOSC<2> is at a high level, the switching unit 500 provides the second oscillation signal VNOSC_CK as the pumping period signal VNOSC. However, when the third test mode signal TNOSC<2> is at a low level, the switching unit 500 provides the first oscillation signal VNOSCI as the pumping period signal VNOSC. The third test mode signal TNOSC<2> can select one of the first and second oscillation signals VNOSCI and VNOSC_CK according to its logical level.

The switching unit 500 includes first to third NAND gates ND1 to ND3 and an inverter IV.

The first NAND gate ND1 responds to the first oscillation signal VNOSCI and the inverted signal of the third test mode signal TNOSC<2>. The second NAND gate ND2 responds to the second oscillation signal VNOSC_CK and the third test mode signal TNOSC<2>.

If the third test mode signal TNOSC<2> is at a inactivated low level, the first NAND gate ND1 provides the first oscillation signal VNOSCI as a valid signal. Since the third test mode signal TNOSC<2> is at the low level, the output of the second NAND gate ND2 is fixed to a high level. Therefore, the first oscillation signal VNOSCI is output as the pumping period signal VNOSC by the third NAND gate ND3.

However, when the third test mode signal TNOSC<2> is activated at a high level, the second NAND gate ND2 provides the second oscillation signal VNOSC_CK as a valid signal. Since the third test mode signal TNOSC<2> is at the high level, the output of the first NAND gate ND1 is fixed to a high level. Therefore, the second oscillation signal VNOSC_CK is output as the pumping period signal VNOSC by the third NAND gate ND3.

Figures 13A, 13B:
FIGS. 13A and 13B are a block diagram and a logic table illustrating the relationship between a test mode signal and a decoding signal, respectively.

In FIGS. 13A and 13B, the first to third test mode signals TNOSC<0:2> are exemplified as test mode signals stored in the test circuit.

The decoder 1 decodes the first to third test mode signals TNOSC<0:2> and provides 8 output signals, that is, 8 decoding signals DECO<0:7>. The decoder 1 means a general 3-to-8 decoding circuit, and thus a detailed description thereof will be omitted.

FIG. 13B is a logic table illustrating the decoded results.

FIG. 13B shows that the first decoding signal DECO<0> to the eighth decoding signal DECO<7> are sequentially activated according to the logical levels of the first to third test mode signals TNOSC<0:2>.

Specifically, in this embodiment, when the third test mode signal TNOSC<2> is at a low level, the first oscillation signal VNOSCI is selected, and the first to fourth decoding signals DECO<0:3> are invalidated. However, when the third test mode signal TNOSC<2> is at a high level, the second oscillation signal VNOSC_CK is selected. In this case, the second oscillation signal VNOSC_CK can be selected by selecting any one of the signals having different periods that are obtained by various frequency dividers. Therefore, the fifth to eighth decoding signals DECO<5:8> are effective selection signals for selecting the signals having different periods.

Figure 14:
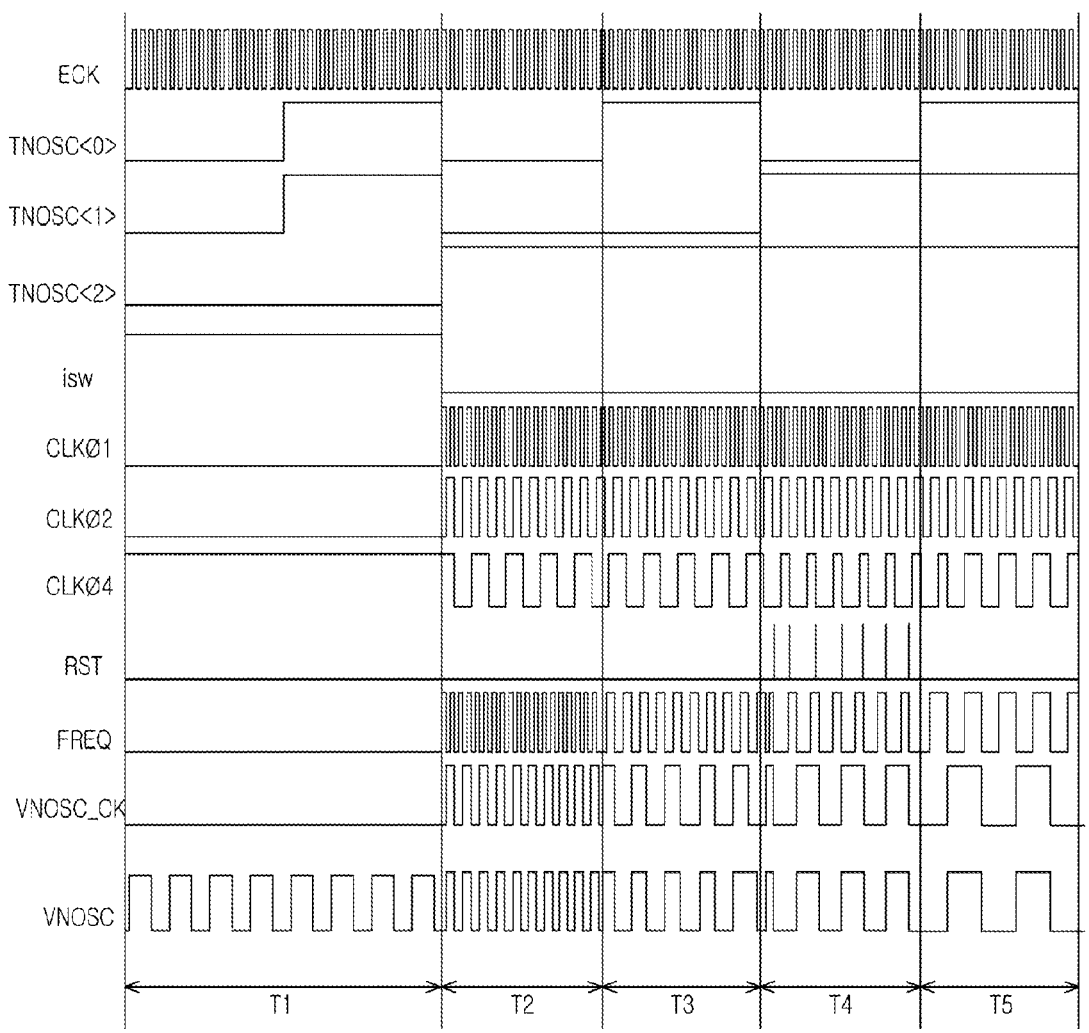
FIG. 14 is a timing chart illustrating the operation of the internal voltage generating circuit shown in FIG. 2A.

Referring to FIG. 14, a first section T1 will be described with reference to FIG. 14.

In the first section T1 in which the third test mode signal TNOSC<2> is at a low level, the oscillator activating signal isw becomes a high level to generate the first oscillation signal VNOSCI. Therefore, in the first section T1, the ring oscillator activated by the oscillator activating signal isw generates the pumping section signal VNOSC.

However, in second to fifth sections T2 to T5, the third test mode signal TNOSC<2> is at a high level. Therefore, the external clock ECK is divided into clock signals having different sections, that is, the clock signal CLK, the divide-by-two clock signal CLKϕ2, and the divide-by-four clock signal CLKϕ4.

In this embodiment, according to the decoded results of the first to third test mode signals TNOSC<0:2>, the fifth decoding signal DECO<4> is activated in the second section T2, the sixth decoding signal DECO<5> is activated in the third section T3, the seventh decoding signal DECO<6> is activated in the fourth section T4, and the eighth decoding signal DECO<7> is activated in the fifth section T5.

In the second section T2, the clock signal CLK is selected as the frequency signal FREQ. The duty ratio of the selected clock signal is corrected, and the frequency thereof is finally divided to generate the second oscillation period signal VNOSC_CK. Then, the second oscillation period signal VNOSC_CK is output as the pumping period signal VNOSC. The pumping period signal VNOSC has a period that is two times longer than that of the external clock ECK. Therefore, a high-frequency oscillation signal is obtained.

In the third section T3, the divide-by-two clock signal CLKϕ2 is selected as the frequency signal FREQ. Then, the frequency signal FREQ is finally divided and the duty ratio thereof is corrected to generate the second oscillation period signal VNOSC_CK. In this way, the pumping period signal VNOSC has a period that is four times longer than that of the external clock ECK.

In the fourth section T4, since the seventh decoding signal DECO<6> is activated, the reset signal RST is also activated. That is, at the timing when the seventh decoding signal DECO<6>, the divide-by-two clock signal CLKϕ2, and the divide-by-four clock signal CLKϕ4 are all activated, the reset signal RST is generated. A divide-by-three clock signal generated from the reset signal RST and the divide-by-four clock signal CLKϕ4 is selected as the frequency signal FREQ. The frequency of the selected signal is finally divided to generate the second oscillation period signal VNOSC_CK, and the pumping period signal VNOSC is output as a clock signal having a period that is six times longer than that of the external clock ECK.

Similarly, in the fifth section T5, the divide-by-four clock signal CLKϕ4 is selected as the frequency signal FREQ, and thus the pumping period signal VNOSC is output as a clock signal having a period that is eight times longer than that of the external clock ECK.

As described above, according to this embodiment, the clock signals obtained by dividing the frequency of the external clock by various numbers using the test mode signal as well as the oscillation period signal generated by the ring oscillator can be used as the oscillation period signal.

Therefore, a high-frequency signal can be used as a pumping period signal for pumping a voltage up to a predetermined voltage level, and thus it is possible to improve charge pump driving force. In addition, it is possible to generate signals having different periods as well as a signal having a fixed period and thus flexibly drive the charge pump.

What is claimed is:

1. An internal voltage generating circuit for pumping charge to generate an internal driving voltage, comprising:
   a first oscillation signal generating unit that provides a first oscillation signal in response to a detected internal voltage and a predetermined test mode signal, the first oscillation signal having a first period;
   a second oscillation signal generating unit that divides an external clock to provide a second oscillation signal having a variable oscillation period, the second oscillation signal having a second period that is different from the first period; and
   a switching unit that selects an output from the first oscillation signal or the second oscillation signal in response to the predetermined test mode signal and provides the selected signal as a pumping period signal.

2. The internal voltage generating circuit of claim 1, when the predetermined test mode signal is inactivated, wherein the first oscillation signal generating unit receives an oscillator activating signal that is activated in response to the detected internal voltage, inverts the logical level of the received signal, and provides the first oscillation signal.

3. The internal voltage generating circuit of claim 2, wherein the first oscillation signal generating unit includes a plurality of inverting units forming a closed loop.

4. The internal voltage generating circuit of claim 3, wherein the first oscillation signal generating unit generates the first oscillation signal having a fixed period that depends on delay time while passing through the plurality of inverting units.

5. The internal voltage generating circuit of claim 1, wherein the second oscillation signal generating unit includes:
   a clock signal buffer that buffers the external clock to provide a clock signal;
   a frequency dividing unit that divides the clock signal to provide a plurality of divided clock signals;
   a divided clock selecting unit that receives the clock signal and the plurality of divided clock signals, selects one of the received signals, and provides the selected signal as a frequency signal; and
   a final frequency dividing unit that finally divides the frequency signal to provide the second oscillation signal.

6. The internal voltage generating circuit of claim 5, wherein the clock signal buffer receives the external clock and the predetermined test mode signal, and buffers the external clock when the predetermined test mode signal is activated.

7. The internal voltage generating circuit of claim 5, wherein the frequency dividing unit comprises:
   a first frequency divider that divides the clock signal by 2 to generate a divide-by-two clock signal;
   a second frequency divider that is connected in series to the first frequency divider, receives the divide-by-two clock signal, and divides the divide-by-two clock signal by 2 to generate a divide-by-four clock signal; and
   a reset signal generator that receives the divide-by-two clock signal, the divide-by-four clock signal, and a predetermined specific decoding signal and generates a reset signal.

8. The internal voltage generating circuit of claim 7, wherein the reset signal is fed back to the first frequency divider and the second frequency divider to initialize the first frequency divider and the second frequency divider.

9. The internal voltage generating circuit of claim 8, wherein the predetermined specific decoding signal is a divide-by-three clock signal activating signal, and when the predetermined specific decoding signal is activated and the reset signal whose activation timing is adjusted is received, the second frequency divider generates a divide-by-three clock signal.

10. The internal voltage generating circuit of claim 9, wherein the divided clock selecting unit receives predetermined first to third decoding signals for respectively selecting the clock signal, the divide-by-two clock signal, and the divide-by-four clock signal, and selects one of the received clock signals that responds to any one of the activated decoding signals.

11. The internal voltage generating circuit of claim 10,
wherein the divided clock selecting unit further comprise to select the divide-by-three clock signal in response to the predetermined specific decoding signal that is activated and to provide the selected signal as the frequency signal.

12. The internal voltage generating circuit of claim 5,
wherein the final frequency dividing unit divides the input frequency signal by 2 to correct the duty ratio thereof, and provides the divided frequency signal as the second oscillation signal.

13. An internal voltage generating circuit comprising:
a voltage detector that detects the level of an internal voltage fed back and provides an oscillation control signal;
a pumping signal generating block that provides a pumping period signal having a first period that is a fixed period and that is oscillated by a ring oscillator in response to the oscillation control signal, and provides as the pumping period signal a clock signal having a second period that is a variable period and that is generated by dividing an external clock in a test mode; and
a charge pump that pumps charge in response to the pumping period signal to output the internal voltage,
wherein the first period of the pumping period signal having the fixed period and the second period of the pumping period signal having the variable period are generated to be different periods, and
wherein the pumping period signal generating unit comprises a switching unit that selects an output from a first oscillation signal or a second oscillation signal in response to the predetermined test mode signal, and provides the selected signal as the pumping period signal.

14. The internal voltage generating circuit of claim 13,
wherein the pumping signal generating block comprises:
a control signal generating unit that generates an oscillator activating signal in response to the oscillation control signal and a predetermined test mode signal; and
a pumping period signal generating unit that selects a first oscillation period signal or a second oscillation period signal obtained by dividing the external clock as a signal having a fixed period, in response to the oscillator activating signal and the external clock.

15. The internal voltage generating circuit of claim 14,
wherein the predetermined test mode signal determines whether to activate the oscillator activating signal.

16. The internal voltage generating circuit of claim 14,
wherein the pumping period signal generating unit selects the second oscillation signal when an inactivated oscillator activating signal is received, and selects the first oscillation signal when an activated oscillator activating signal is received, and
the pumping period signal generating unit provides the selected signal as the pumping period signal.

17. The internal voltage generating circuit of claim 14,
wherein the pumping period signal generating unit further comprises:
a first oscillation signal generating unit that generates the first oscillation signal in response to the oscillator activating signal;
a second oscillation signal generating unit that divides the external clock to generate the second oscillation signal having a variable oscillation period.

18. The internal voltage generating circuit of claim 17,
wherein the first oscillation signal generating unit includes a plurality of inverting units forming a closed loop.

19. The internal voltage generating circuit of claim 18,
wherein the first oscillation signal generating unit generates the first oscillation signal having a fixed period that depends on delay time while passing through the plurality of inverting units.

20. The internal voltage generating circuit of claim 17,
wherein the second oscillation signal generating unit comprises:
a clock signal buffer that buffers the external clock to provide a clock signal;
a frequency dividing unit that divides the clock signal to provide a plurality of divided clock signals;
a divided clock selecting unit that receives the clock signal and the plurality of divided clock signals, selects one of the received signals, and provides the selected signal as a frequency signal; and
a final frequency dividing unit that finally divides the frequency signal to provide the second oscillation signal.

21. The internal voltage generating circuit of claim 17,
wherein the clock signal buffer receives the external clock and the specific test mode signal, and buffers the external clock when the specific test mode signal is activated.

22. The internal voltage generating circuit of claim 17,
wherein the frequency dividing unit comprises:
a first frequency divider that divides the clock signal by 2 to generate a divide-by-two clock signal;
a second frequency divider that is connected in series to the first frequency divider, receives the divide-by-two clock signal, and divides the divide-by-two clock signal by 2 to generate a divide-by-four clock signal; and
a reset signal generator that receives the divide-by-two clock signal, the divide-by-four clock signal, and the predetermined specific decoding signal and generates a reset signal.

23. The internal voltage generating circuit of claim 22,
wherein the reset signal is fed back to the first frequency divider and the second frequency divider to initialize the first frequency divider and the second frequency divider.

24. The internal voltage generating circuit of claim 20,
wherein the divided clock selecting unit receives predetermined first to third decoding signals for respectively selecting the clock signal, the divide-by-two clock signal, and the divide-by-four clock signal, and selects one of the received clock signals that responds to any one of the activated decoding signals.

25. The internal voltage generating circuit of claim 24,
wherein the divided clock selecting unit further comprise to select the divide-by-three clock signal in response to the predetermined specific decoding signal that is activated, and to provide the selected signal as the frequency signal.

* * * * *